(12) United States Patent
Simmons et al.

(10) Patent No.: US 7,392,446 B1
(45) Date of Patent: Jun. 24, 2008

(54) TEST CHANNEL USAGE REDUCTION

(75) Inventors: Tuyet Ngoc Simmons, Los Gatos, CA (US); Brian Sadler, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 592 days.

(21) Appl. No.: 11/156,039

(22) Filed: Jun. 17, 2005

(51) Int. Cl.
*G01R 31/28* (2006.01)
*H03K 19/00* (2006.01)
*G06F 7/38* (2006.01)

(52) U.S. Cl. .............................. 714/725; 326/16; 326/39

(58) Field of Classification Search .................. 714/725
See application file for complete search history.

(56) References Cited

U.S. PATENT DOCUMENTS

| | | | |
|---|---|---|---|
| 5,773,994 A * | 6/1998 | Jones | 326/41 |
| 7,010,667 B2 * | 3/2006 | Vorbach et al. | 712/10 |
| 2005/0138500 A1 * | 6/2005 | Sul et al. | 714/724 |
| 2005/0262396 A1 * | 11/2005 | Woodward et al. | 714/30 |

OTHER PUBLICATIONS

"Dynamic testing of Xilinx Virtex-II field programmable gate array (FPGA) input/output blocks (IOBs)" by Swift et al. IEEE Transactions on Nuclear Science, Publication Date: Dec. 2004 vol. 51, Issue: 6 On pp. 3469-3474 ISSN: 0018-9499 Inspec Accession No. 8225503.*

Xilinx, Inc.; "The Programmable Logic Data Book 2000"; Published Apr. 2000; available from Xilinx, Inc., 2100 Logic Drive, San Jose, California 95124; pp. 3-75 through 3-96.

* cited by examiner

*Primary Examiner*—Cynthia Britt
(74) *Attorney, Agent, or Firm*—W. Eric Webostad (57) ABSTRACT

Testing an integrated circuit having programmable logic is described. Programmable logic is configured as a daisy-chain of registers (310-1 through 310-(N+1)) in a closed input/output loop to register a logic 1 and logic 0s. The logic states are circulated around the closed input/output loop. Operation of output blocks (210-1 through 210-N) is controlled responsive to a series of outputs (316-1 through 316-N) provided from a portion of the daisy-chain of registers (310-1 through 310-N) to selectively place an output block of output blocks (210-1 through 210-N) in an output mode responsive to the logic 1 output in the series of outputs while leaving the output blocks remaining in a non-output mode responsive to the logic 0s in the series of outputs. The output blocks (210-1 through 210-N) are commonly coupled at an output node (212) for coupling to a single test channel, as only one output block is in the output mode at a time.

20 Claims, 11 Drawing Sheets

TEST CHANNEL USAGE REDUCTION

FIELD OF THE INVENTION

One or more aspects of the invention relate generally to integrated circuits and, more particularly, to reducing the number of test channels for testing an integrated circuit.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex® FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.)

Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

As is known, FPGAs may be tested using programmed Automated Test Equipment ("ATE" or a "tester"). However, testing an FPGA may be limited by the number of available channels of a tester ("test channels"). Heretofore, FPGAs were tested by assigning one IOB to one test channel for a one-to-one correspondence between IOBs and test channels. Unfortunately, this testing method may consume all available test channels for testing an FPGA, which leaves no test channels for simultaneous testing of multiple FPGAs coupled to the same ATE.

Accordingly, it would be desirable and useful to facilitate simultaneous testing of multiple FPGAs coupled to the same ATE.

SUMMARY OF THE INVENTION

One or more aspects of the invention generally relate to integrated circuits and, more particularly, to reducing the number of test channels for testing an integrated circuit.

An aspect of the invention is a system for testing an integrated circuit having programmable logic. The integrated circuit is coupled to a tester. A first output pad and a second output pad of the integrated circuit are coupled to a common node to couple a test channel of the tester to the first output pad and the second output pad via the common node. The first output pad is coupled to an output port of a first tri-state buffer. The second output pad is coupled to an output port of a second tri-state buffer. An output port of a first register is coupled to a control port of the first tri-state buffer and to an input port of a second register. An output port of the second register is coupled to a control port of the second tri-state buffer and to an input port of a third register. An output port of the third register is coupled to an input port of the first register. The first register and the second register are coupled to receive a set signal to put the first register and the second register in a first state. The third register is coupled to receive an inverted version of the set signal to put the third register in a second state. The first, second, and third registers are coupled to receive a first clock signal.

Another aspect of the invention is a system for testing an integrated circuit having programmable logic, where the integrated circuit is coupled to a tester. A first output pad and a second output pad of the integrated circuit are coupled to a first common node to couple a first test channel of the tester to the first output pad and the second output pad via the common node, where the first output pad is coupled to a first output port of a first tri-state buffer and where the second output pad is coupled to a first output port of a second tri-state buffer. A third output pad and a fourth output pad of the integrated circuit are coupled to a second common node to couple a second test channel of the tester to the third output pad and the fourth output pad via the common node, where the third output pad is coupled to a second output port of the first tri-state buffer and where the fourth output pad is coupled to a second output port of the second tri-state buffer. An output port of a first register is coupled to a control port of the first tri-state buffer and to an input port of a second register. An output port of the second register is coupled to a control port of the second tri-state buffer and to an input port of a third register. An output port of the third register is coupled to an input port of the first register. The first register and the second register are coupled to receive a set signal to put the first register and the second register in a first state. The third register is coupled to receive an inverted version of the set signal to put the third register in a second state. The first register, the second register, and the third register are coupled to receive a clock signal.

Another aspect of the invention is a method for testing an integrated circuit having programmable logic. The method includes: programming a portion of the programmable logic to configure the integrated circuit to be coupled at an output node, and coupling the output node to a test channel of a tester. The portion of the programmable logic is configured to: receive a set signal to a daisy-chain of registers in a closed input/output loop, where the set signal is inverted for one register of the daisy-chain of registers to provide one first logic state and a plurality of second logic states for respective registration in the daisy-chain of registers; receive a clock signal to clock the daisy-chain of registers responsive to cycles of the clock signal; circulate the one first logic state and the plurality of second logic states around the closed input/ output loop responsive to the cycles of the clock signal, where the one first logic state is registered in only one register of the daisy-chain of registers at a time such that the one first logic state is output from a different register responsive to each cycle of the clock signal; generate a series of outputs from a portion of the daisy-chain of registers responsive to the cycles of the clock signal; provide the series of outputs respectively to the portion of the daisy-chain of registers; commonly coupled output blocks at the output node; control operation of the output blocks responsive to the series of outputs provided from the portion of the daisy-chain of registers to selectively place an output block of the output blocks in an output mode responsive to the one first logic state output in the series of outputs while leaving the output blocks remaining in a non-output mode responsive to the plurality of second logic states in the series of outputs.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different.

Figure 1:
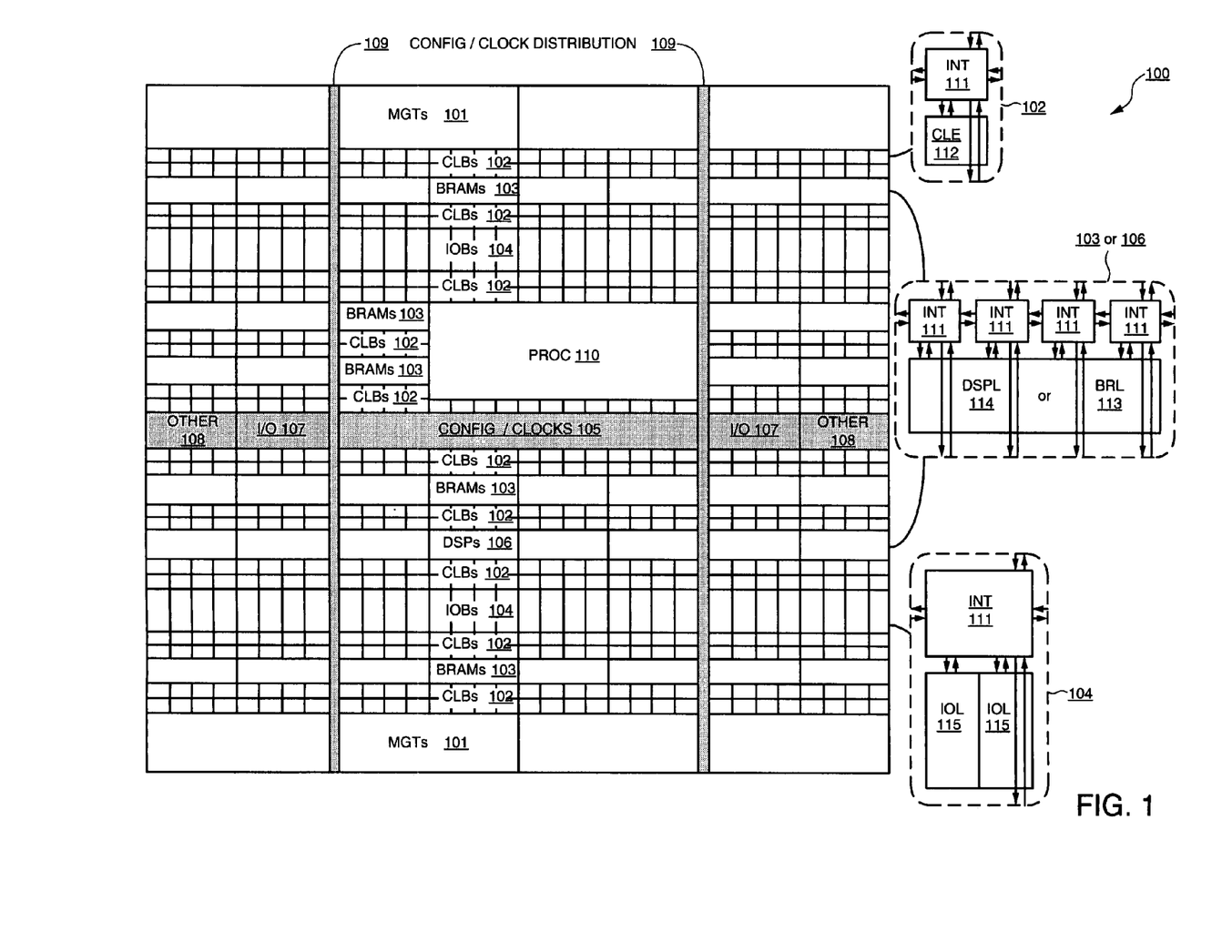
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
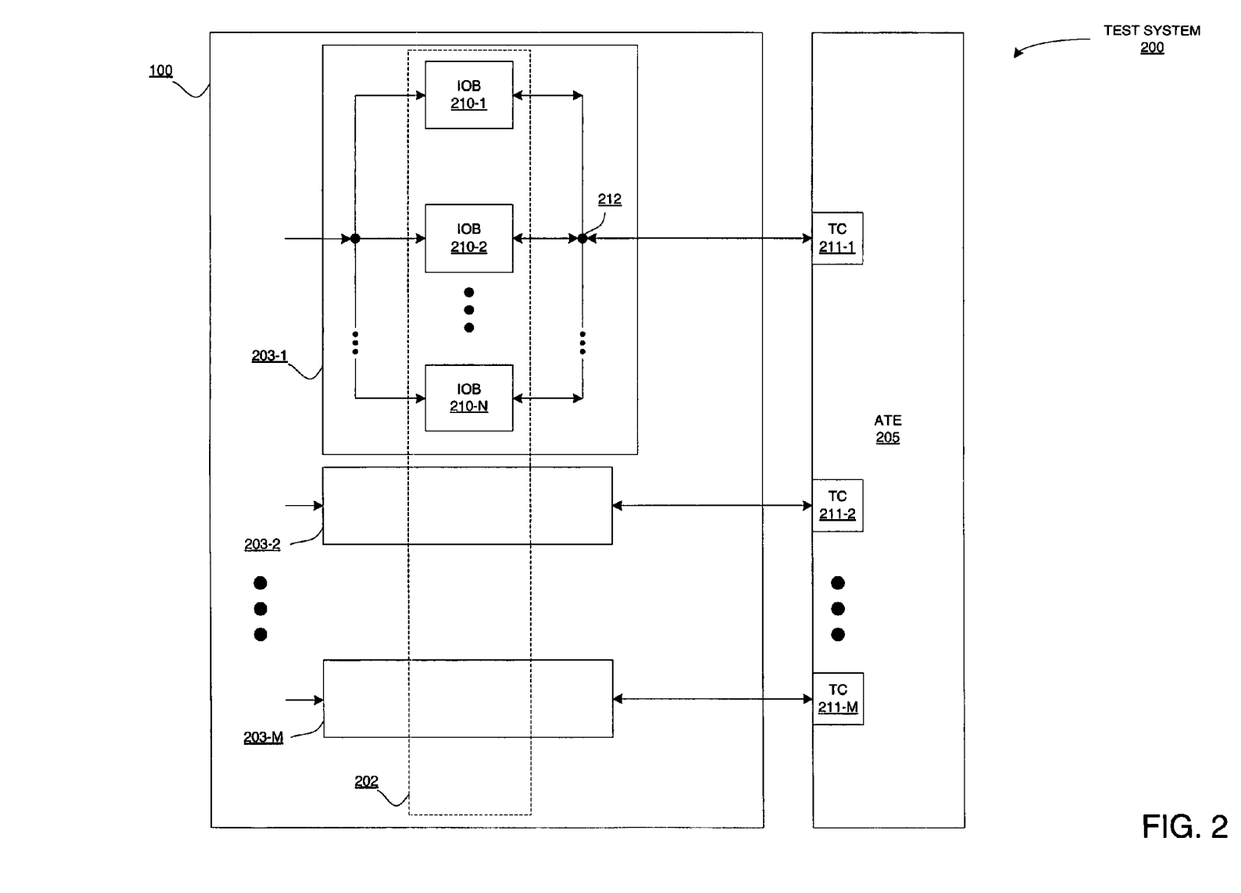
FIG. 2 is a high-level block diagram depicting an exemplary embodiment of a test system.

FIG. 2 is a high-level block diagram depicting an exemplary embodiment of a test system 200. Test system 200 includes FPGA 100 coupled to ATE 205. ATE 205 includes test channels ("TCs") 211-1 through 211-M, for M an integer greater than one. FPGA 100 includes TC circuit blocks 203-1 through 203-M. TC circuit blocks 203-1 through 203-M are respectively coupled to TCs 211-1 through 211-M.

Each of TC circuit blocks 203-1 through 203-M may include one or more IOBs from a column of IOBs 202. More particularly with reference to TC circuit block 203-1, IOBs 210-1 through 210-N, for N a positive integer greater than one, are coupled in parallel. Each IOB 210-1 through 210-N may represent an internal test channel of FPGA 100, where multiple test channels internal to FPGA 100 of a TC circuit block 203-1 are coupled to a single TC 211-1 of ATE 205 via a common node 212.

Figure 3A:
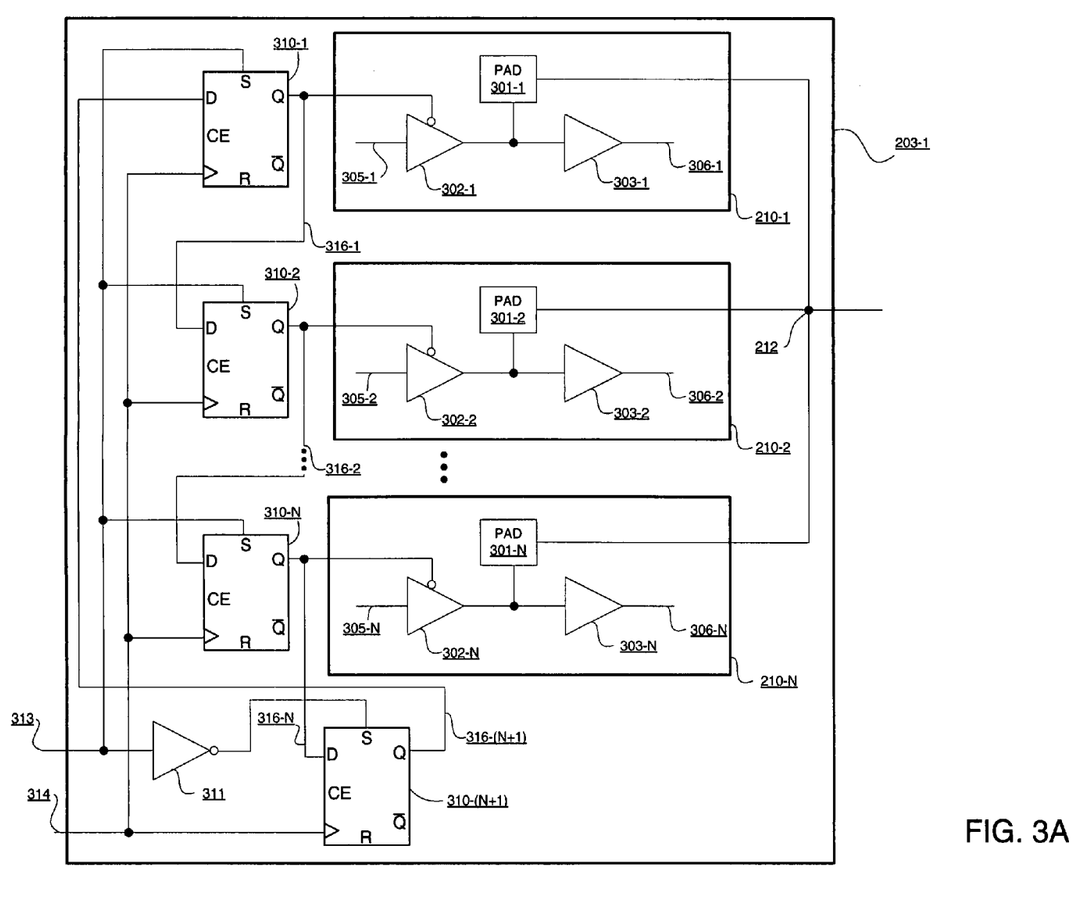
FIG. 3A is a schematic diagram depicting an exemplary embodiment of a test channel circuit block.

FIG. 3A is a schematic diagram depicting an exemplary embodiment of TC circuit block 203-1 configured with registers to set an initial state. TC circuit block 203-1 includes IOBs 210-1 through 210-N respectively coupled to receive respective outputs from flip-flops 310-1 through 310-N therefrom to tri-state buffers 302-1 through 302-N. More particularly, output of flip-flop 310-1 is provided to a control port of tri-state buffer 302-1 to put tri-state buffer 302-1 into or out of a tri-state mode. Accordingly, outputs of flip-flops 310-2 through 310-N are respectively provided to control ports of corresponding tri-state buffers 302-2 through 302-N. Input/output ("I/O") pads 301-1 through 301-N corresponding to IOBs 210-1 through 210-N are coupled to node 212. With reference to FIG. 2, it should be understood that node 212 may be used to couple FPGA 100 to TC 211-1. Moreover, input may be provided to I/O pads 301-1 through 301-N coupled to respective input buffers 303-1 through 303-N for input to FPGA 100 of FIG. 2 via respective data paths 306-1 through 306-N.

Each of flip-flops 310-1 through 310-N may be set responsive to set signal 313 by providing such set signal to a respective set port of each of those flip-flops. Additionally, set signal 313 may be provided to inverter 311. Output of inverter 311 may be provided to a set port of flip-flop 310-(N+1). Thus, for example, for flip-flops 310-1 through 310-N set to a logic 1 initial value, flip-flop 310-(N+1) is set to a logic 0 value. Furthermore, each of flip-flops 310-1 through 310-(N+1) is clocked responsive to clock signal 314.

Accordingly, with respect to a first clock pulse, output from flip-flop 310-(N+1) is a logic 0, which is provided as an input to a data input port of flip-flop 310-1 via signal path 316-(N+1). For the logic 1 initially registered in flip-flop 310-1, on the first clock pulse, output of flip-flop 310-1 is a logic 1; however, on a second clock pulse, which activates tri-state buffer 302-1, output of flip-flop 310-1 is a logic 0 such that input 305-1 to tri-state buffer 302-1 is provided to I/O pad 301-1. In other words, tri-state buffer 302-1 is put in a non-tri-state mode from a tri-state mode.

Furthermore, responsive to this second clock pulse, the logic 0 output from flip-flop 310-1 is provided to a data input port of flip-flop 310-2 via data signal path 316-1. Output of flip-flop 310-2 is provided via data signal path 316-2 to a subsequent flip-flop in the chain of flip-flops formed by flip-flops 310-1 through 310-N. Notably, because flip-flops 310-2 through 310-N have been initially set to logic high values responsive to set signal 313, their respective outputs are initially logic highs, and thus corresponding tri-state buffers 302-2 through 302-N are in a tri-state mode, meaning that their respective inputs 305-2 through 305-N are not provided to corresponding I/O pads 301-2 through 301-N. However, as a logic 0 is serially passed through the chain of flip-flops, periodically an output of one of such flip-flops is a logic 0.

Continuing the example, on a third clock pulse, the logic 0 input to flip-flop 310-2 from flip-flop 310-1 is output from flip-flop 310-2 to activate tri-state buffer 302-2, namely to put it in a non-tri-state mode to allow input 305-2 to pass to I/O pad 301-2. Furthermore, it should be appreciated that on the first clock pulse, the logic 1 registered in flip-flop 310-N was input to flip-flop 310-(N+1) via data signal path 316-N. Accordingly, on the second clock pulse, output of flip-flop 310-(N+1) is a logic 1, which is input to flip-flop 310-1. Thus, it should be appreciated that a logic 0 initially set in flip-flop 310-(N+1) is sequentially cycled through each of flip-flops 310-1 through 310-N, and may be provided again to flip-flop 310-(N+1) at the conclusion of a test cycle. Furthermore, it should be appreciated that the logic 0 is only registered in one of flip-flops 310-1 through 310-N at a time, and the remaining flip-flops of flip-flops 310-1 through 310-N have registered therein a logic 1. In other words, only one tri-state buffer 302-1 through 302-N respectively of IOBs 210-1 through 210-N is put in a non-tri-state mode at a time. This means that only one input 305-1 through 305-N is provided to a corresponding I/O pad 301-1 through 301-N at a time. Thus, multiple test channel outputs as associated with inputs 305-1 through 305-N may be sequentially provided in part via I/O pads 301-1 through 301-N to node 212. As node 212 is coupled to a single TC 211-1, it should be appreciated that multiple internal test channels of TC circuit block 203-1 are thus coupled to a single TC 211-1.

Figure 3B:
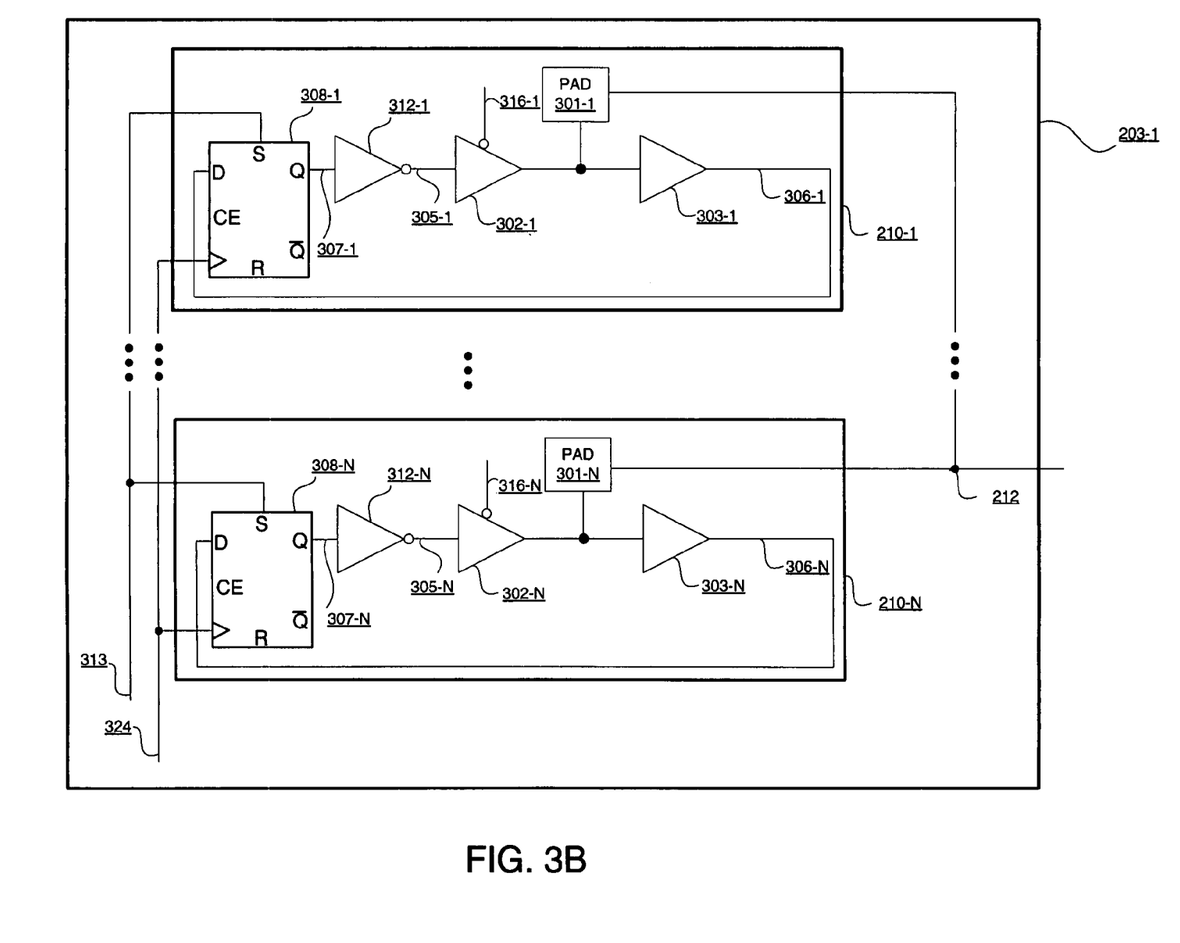
FIG. 3B is a schematic diagram depicting an exemplary embodiment of the test channel circuit block of FIG. 3A having flip-flops as part of input/output blocks ("IOBs") therein.

Hence in one embodiment the programmable logic is configured as a daisy-chain of registers (310-1 through 310-(N+1)) in a closed input/output loop to register a logic 1 and logic 0s. The logic states are circulated around the closed input/output loop. Operation of output blocks (210-1 through 210-N) is controlled responsive to a series of outputs (316-1 through 316-N) provided from a portion of the daisy-chain of registers (310-1 through 310-N) to selectively place an output block of output blocks (210-1 through 210-N) in an output mode responsive to the logic 1 output in the series of outputs while leaving the output blocks remaining in a non-output mode responsive to the logic 0s in the series of outputs. The output blocks (210-1 through 210-N) are commonly coupled at an output node (212) for coupling to a single test channel, as only one output block is in the output mode at a time FIG. 3B is a schematic diagram depicting an alternative exemplary embodiment of TC circuit block 203-1 having flip-flops as part of IOBs 210-1 through 210-N. More particularly, another clock signal other than clock signal 314 of FIG. 3A, namely clock signal 324, may be used to clock each of flip-flops 308-1 through 308-N respectively of IOBs 210-1 through 210-N. Furthermore, flip-flops 308-1 through 308-N may be set responsive to set signal 313 to logic high level. Having registered a logic 1 in each of flip-flops 308-1 through 308-N, on a clock pulse from clock signal 324, output of each of those flip-flops will be a logic 1 value. Each such logic 1 value may be provided via respective data output paths 307-1 through 307-N, corresponding to flip-flops 308-1 through 308-N, to an inverter 312-1 through 312-N, likewise corresponding to flip-flops 308-1 through 308-N. Output of each of inverters 312-1 through 312-N may be corresponding inputs 305-1 through 305-N. Notably, as illustratively shown in FIG. 3B, flip-flops 308-1 through 308-N, as well as inverters 312-1 through 312-N, may be internal to IOBs 210-1 through 210-N. However, it should be further appreciated that such flip-flops, as well as inverters, may be external to such IOBs.

Moreover, with reference to FIG. 3A, it should be understood that flip-flops 310-1 through 310-N may be internal or external to IOBs 210-1 through 210-N. Furthermore, with reference to FIG. 3A, it should be appreciated that inverter 311 and flip-flop 310-(N+1) may be internal or external to an IOB.

For the exemplary embodiment of FIG. 3B, a logic high output for each of flip-flops 308-1 through 308-N results in inputs 305-1 through 305-N being logic low values. Input buffers 303-1 through 303-N have their input ports respectively coupled to I/O pads 301-1 through 301-N. As tri-state buffers 302-1 through 302-N are sequentially activated to pass inputs 305-1 through 305-N as inputs to input buffers 303-1 through 303-N, respectively, inputs 305-1 through 305-N may be sequentially input to respective data ports of flip-flops 308-1 through 308-N via respective data paths 306-1 through 306-N. Thus, for example, it should be appreciated that after flip-flop 308-1 outputs a logic 1, such that input 305-1 will be a logic 0 output from inverter 312-1, and if tri-state buffer 302-1 is in a non-tri-state mode, output of such tri-state buffer 302-1 will be provided as a logic 0 to input buffer 303-1 for inputting such logic 0 to a data input port of flip-flop 308-1 via data path 306-1. Accordingly, on a next clock pulse of clock signal 324, output of flip-flop 308-1 will be a logic 0. A logic 0 output from flip-flop 308-1 is fed back to the data input port of flip-flop 308-1 as a logic 1, provided tri-state buffer 302-1 is in a non-tri-state mode. It should be understood that each IOB 210-1 through 210-N may cycle a pattern of logic 1s and logic 0s responsive to frequency of clock pulses of clock signal 324, whether rising or falling edge activated, by holding a respective tri-state buffer in a non-tri-state mode. Thus, it should be appreciated that frequency of clock signal 324 may be higher than clock signal 314 in order to provide a data sequence of logic 1s and logic 0s to an I/O pad for output to a test channel via node 212.

With continuing reference to FIGS. 3A and 3B, it should be appreciated that Low Voltage Complementary Metal Oxide Semiconductor ("LVCMOS"), Low Voltage Transistor-Transistor Logic ("LVTTL"), and Peripheral Component Interface ("PCI") are types of interconnect signaling interface types which may be used. Furthermore, Low Voltage Digitally Controlled Impedance ("LVDCI") IOBs may be configured as illustratively shown with reference to FIGS. 3A and 3B except for negative and positive voltage polarity reference IOBs, which are described below in additional detail. Additionally, a high-speed signaling interface may be used, such as High-Speed Transceiver Logic ("HSTL") and Stub Series Terminated Logic ("SSTL"), where IOBs are configured as in FIGS. 3A and 3B, except IOBs configured to provide a reference voltage level ("Vref"), which are described below in additional detail.

Figure 4:
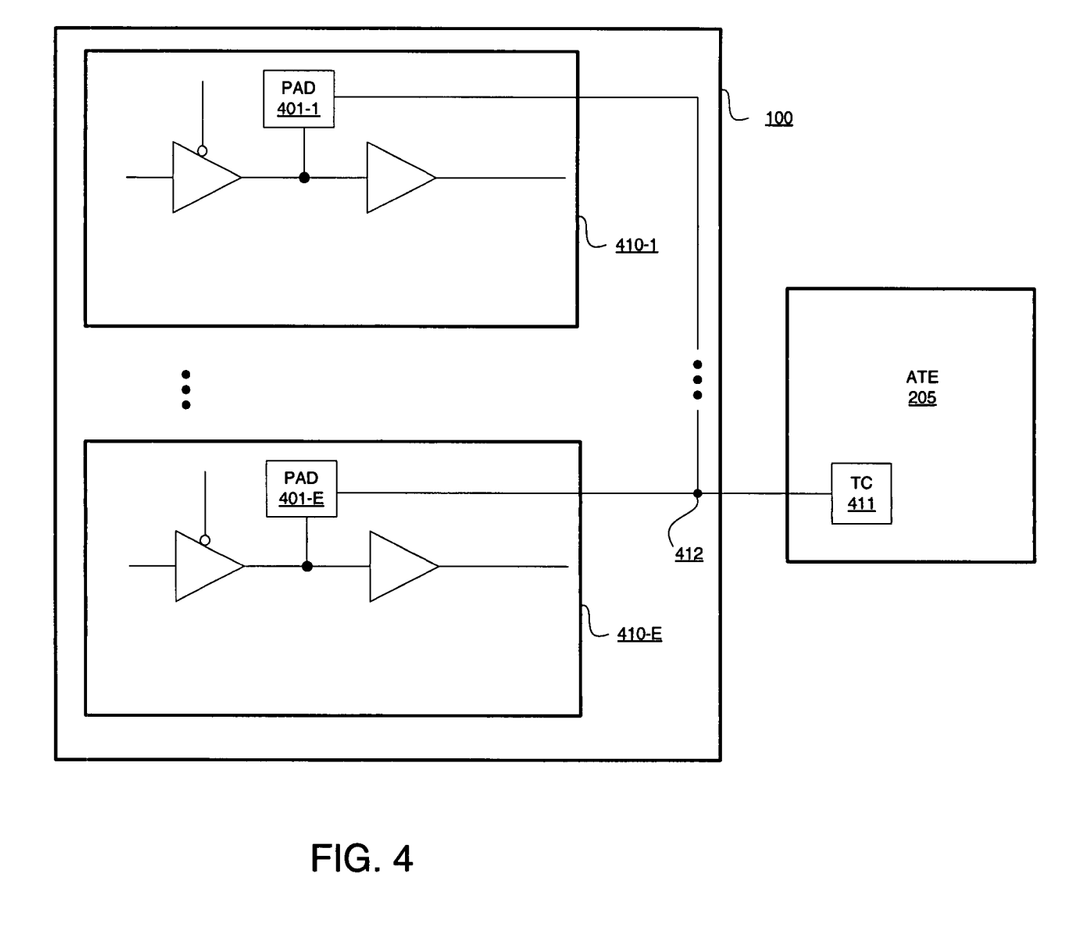
FIG. 4 is a schematic diagram depicting an exemplary embodiment of reference voltage-configured IOBs for high-speed unidirectional communication.

FIG. 4 is a schematic diagram depicting an exemplary embodiment of reference voltage-configured IOBs 410-1 through 410-E, for E a positive integer greater than one, for high-speed unidirectional communication. More particularly, IOBs 410-1 through 410-E may be coupled for HSTL, SSTL, and similar single-ended interfaces. In this embodiment, I/O pads 401-1 through 401-E, respectively of IOBs 410-1 through 410-E, are coupled to a common node 412. Common node 412 may be coupled to a TC 411 of ATE 205. IOBs 410-1 through 410-E may be IOBs of an FPGA 100. IOBs 410-1 through 410-E may be used in conjunction with IOBs configured like IOBs 210-1 through 210-N of FIGS. 3A and 3B, as previously described, to provide a high-speed unidirectional communication interface. Notably, LVCMOS, HSTL, SSTL, DCI, and LVTTL are all single-ended interfaces. However, for high-speed unidirectional interfaces such as HSTL and SSTL, IOBs configured for Vref may be shorted together at a common node 412. Notably, non-Vref configured IOBs in such a high-speed unidirectional interface may not be shorted to Vref configured IOBs at common node 412. In other words, common node 212 of FIG. 3B is different than common node 412, and each is coupled to separate TCs of ATE 205, where TC 411 is different from TC 211-1, for example. Thus, Vref may be provided from ATE 205 via TC 411 to common node 412 for each IOB of IOBs 401-1 through 401-E. Moreover, IOBs of FIGS. 3B and 4 may in combination be used to provide a high-speed, single-ended interface.

Figure 5:
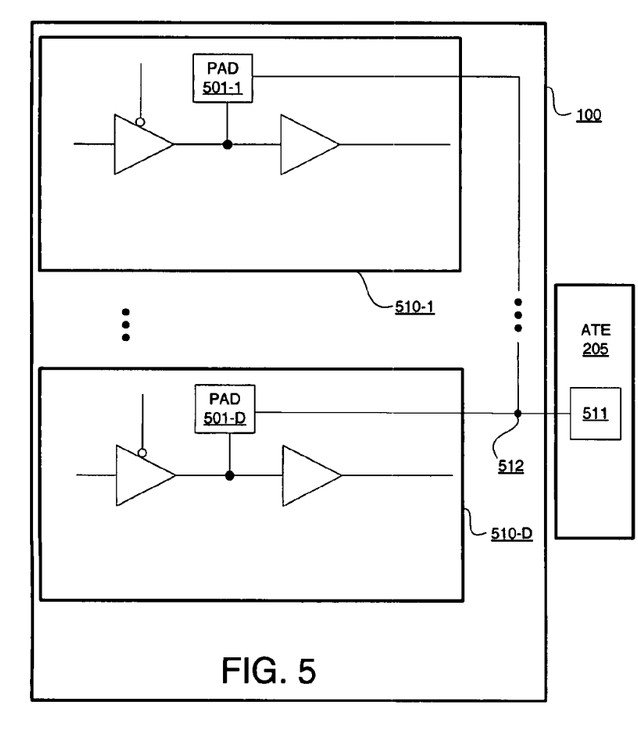
FIGS. 5 and 6 are respective schematic diagrams depicting exemplary embodiments of IOBs configured for reference voltages for a Low Voltage Digitally Controlled Impedance interface.
Figure 6:
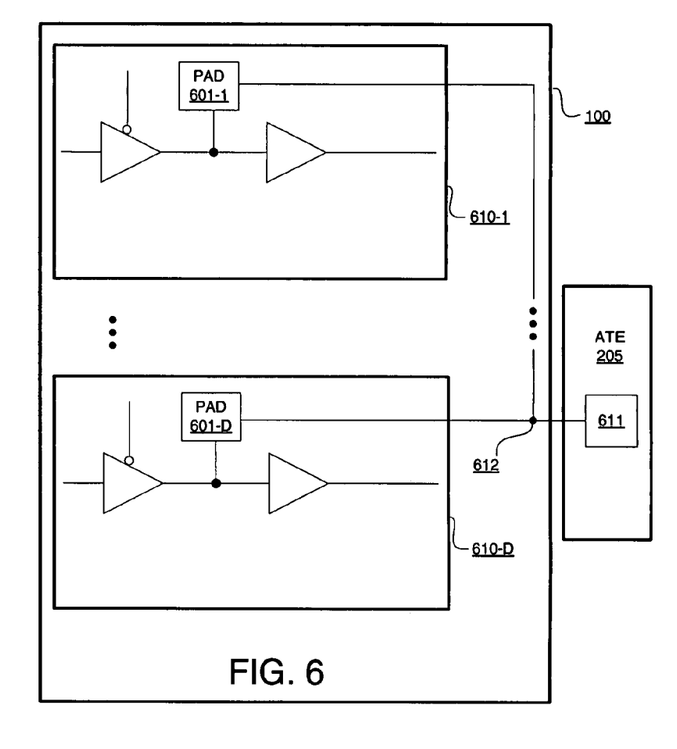

FIGS. 5 and 6 are respective schematic diagrams depicting exemplary embodiments of IOBs configured for reference voltages for a LVDCI interface of FPGA 100 for coupling to ATE 205. With particular reference to FIG. 5, IOBs 510-1 through 510-D, for D a positive integer greater than one, have their respective I/O pads 501-1 through 501-D coupled to a common node 512. In addition to being coupled to a TC 511, common node 512 may be coupled to a resistor (not shown in FIG. 5), for example approximately a 50 Ohm resistor, for coupling to a supply voltage, such as VCCO, to provide a negative polarity reference voltage for LVDCI.

With particular reference to FIG. 6, I/O pads 601-1 through 601-D, respectively of IOBs 610-1 through 610-D, are coupled to a common node 612. In addition to being coupled to a TC 611, common node 612 may be coupled to a resistor (not shown in FIG. 6), for example approximately a 50 Ohm resistor, and to ground to provide a positive polarity voltage reference for LVDCI. IOBs 510-1 through 510-D and 610-1 through 610-D may be used in conjunction with IOBs 210-1 through 210-N as configured in FIGS. 3A and 3B to provide an LVDCI interface.

With reference to FIGS. 5 and 6, it should be appreciated that all IOBs configured to provide a negative polarity reference voltage may be shorted to a common node 512, and that all IOBs configured to provide a positive polarity reference voltage may be shorted to a common node 612, but IOBs configured for a negative polarity reference voltage may not be shorted to IOBs configured for a positive polarity reference voltage. In other words, common nodes 512 and 612 are separate nodes, and thus TCs 511 and 611 are separate TCs. Moreover, IOBs configured as in FIG. 3B may not be shorted to any IOB configured to provide a polarity reference voltage. In other words, no combination of any of two or more of common nodes 212, 512, and 612 may be shorted together, and thus each of TCs 211-1, 511, and 611 is a separate TC. Thus, IOBs of FIGS. 3B, 5 and 6 may in combination be used to provide a DCI interface.

Figure 7:
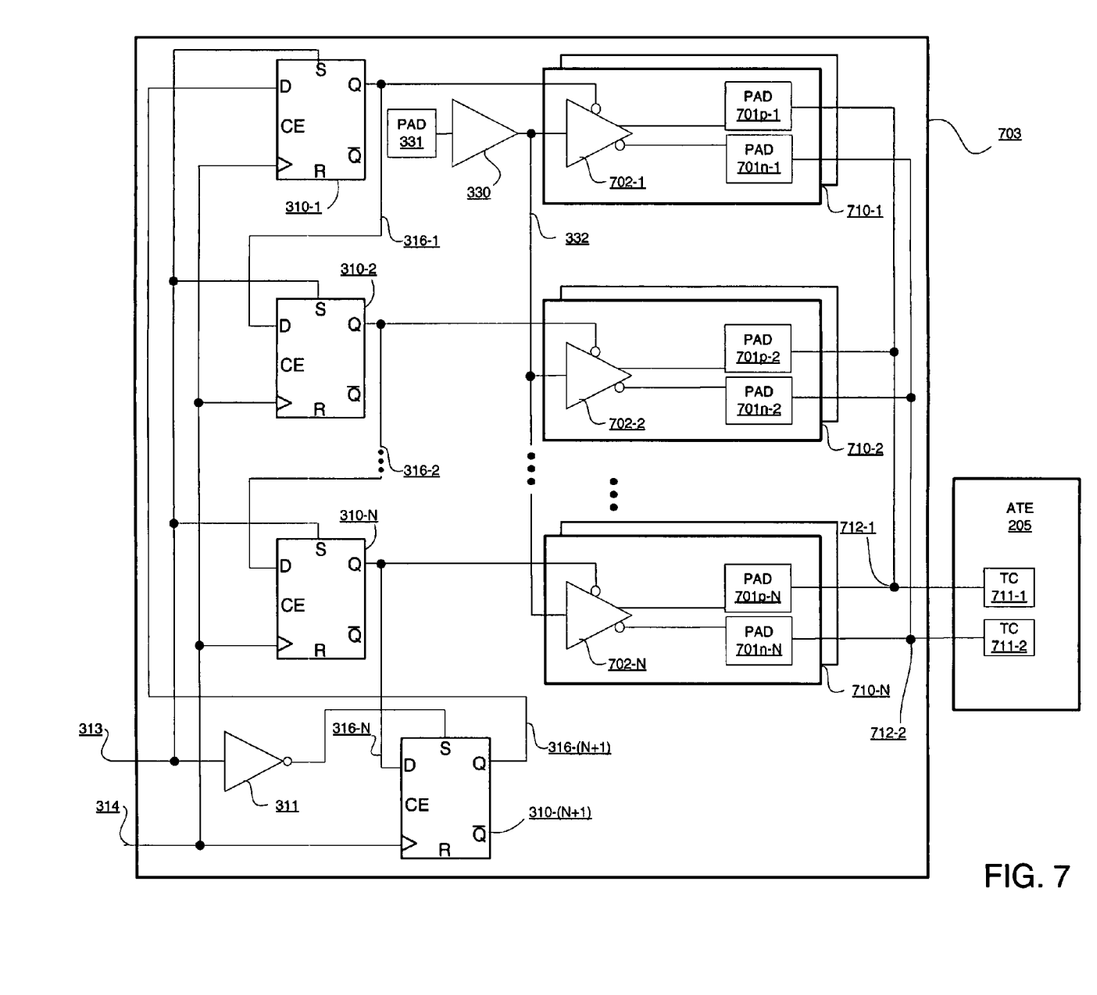
FIG. 7 is a schematic diagram depicting an exemplary embodiment of an interface circuit block which may be implemented in an FPGA, such as the FPGA of FIG. 1.

FIG. 7 is a schematic diagram depicting an exemplary embodiment of an interface circuit block 703 which may be implemented in an FPGA, such as FPGA 100 of FIG. 1. Notably, interface circuit block 703 may be a single such configured circuit block in FPGA 100 of FIG. 1, or multiple interface circuit blocks 703 may be implemented in such an FPGA. Interface circuit block 703 may be used for a differential ended interface, such as Low Voltage Differential Signaling ("LVDS"; including mini-LVDS), Low-Voltage Positive Emitter-Coupled Logic ("LVPECL"), Reduced Swing Differential Signaling ("RSDS"), and Lightning Data Transport ("LDT"), among other known types of differential ended signaling protocols.

Notably, all positive and negative reference level output pairs for these types of differential signaling are provided via output pads 701p-1 through 701p-N, for a positive level and via output pads 701n-1 through 701n-N for a negative level. Output pads 701n-1 through 701n-N are of respective IOBs, and output pads 701p-1 through 701p-N are of respective IOBs separate from the IOBs of output pads 701n-1 through

701n-N. Accordingly, there are 2N IOBs. Furthermore, though each IOB has a tri-state buffer, because IOBs are operated in pairs, these individual tri-state buffers are disabled and replaced with a single tri-state buffer having separate positive and negative output ports. Accordingly, an inverter may be used for the negative output port, as illustratively indicated. Thus, for purposes of clarity and not limitation, pairs of IOBs are illustratively shown as IOBs 710-1 through 710-N, where each IOB 710-1 through 710-N includes a pair of output pads and where each IOB 710-1 through 710-N includes a respective tri-state output buffer 702-1 through 702-N with a positive and a negative output terminal, though there may actually be two IOBs with operated as a pair. For example IOB 710-1 with output pads 701p-1 and 701n-1 may actually be two IOBs with separate output pads and with one tri-state buffer 702-1 shared between the two IOBs, where one of the two IOBs is coupled for a positive polarity output and the other of the IOBs of the pair is coupled for a negative polarity output.

Notably, interface circuit block 703 includes the same chain of flip-flops 310-1 through 310-(N+1), as previously described, to selectively place each tri-state output buffer 702-1 through 702-N in either a tri-state or non-tri-state mode, where a logic 0 is sequentially circulated through the chain of flip-flops. Input to tri-state buffers 702-1 through 702-N may be provided from the output of buffer 330. Input to buffer 330 may be obtained from pad 331. For example, if input pad 331 is set to a logic 1, then output pad 701p-1 is expected to be a logic high and output pad 701n-1 is expected to be a logic low. But, for example, if input pad 331 is set to a logic 0, then output pad 701p-1 is expected to be a logic low, and output pad 701n-1 is expected to be a logic high.

Notably, output pads 701n-1 through 701n-N may be shorted together at a common node 712-2 for coupling to a TC 711-2 of ATE 205, and output pads 701p-1 through 701p-N may be shorted together at a common node 712-1 for coupling to a TC 711-1 of ATE 205. However, a positive output terminal may not be shorted to a negative output terminal, and thus TCs 711-1 and 711-2 are separate TCs.

Figure 8:
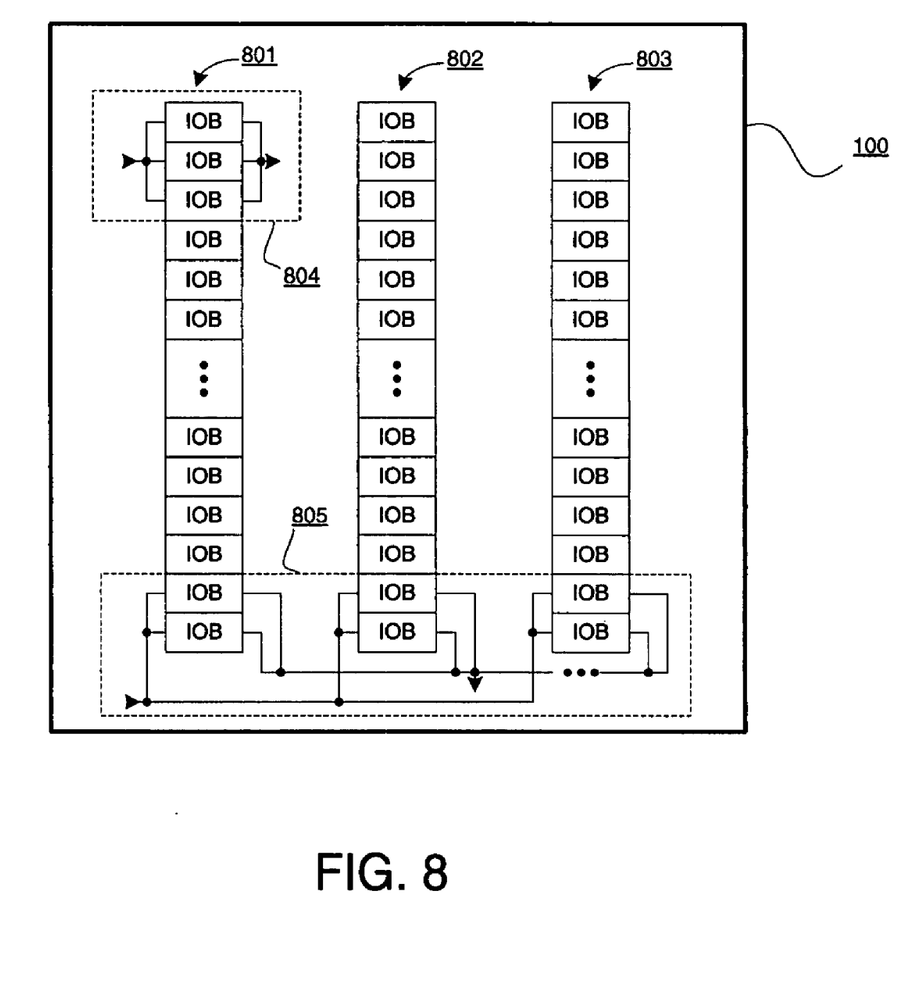
FIG. 8 is a high-level block diagram depicting an exemplary embodiment of the FPGA of FIG. 1 having columns of IOBs.

FIG. 8 is a high-level block diagram depicting a exemplary embodiment of FPGA 100 having columns of IOBs 801, 802, and 803. Though three columns of IOBs are illustratively shown, it should be understood that fewer or more columns of IOBs may be used. It should be appreciated that IOBs from a same column, such as IOBs from column 801, may be coupled together to provide input or output to a test channel, as illustratively shown in dashed box 804. Additionally, it should be appreciated that IOBs from each of columns 801, 802, and 803 may be coupled together to provide an I/O interface as illustratively shown with respect to dashed box 805. Thus, it should be appreciated that although in the prior examples IOBs of a single column were coupled together, multiple IOBs may be coupled together from different columns to provide an I/O interface.

Figure 9:
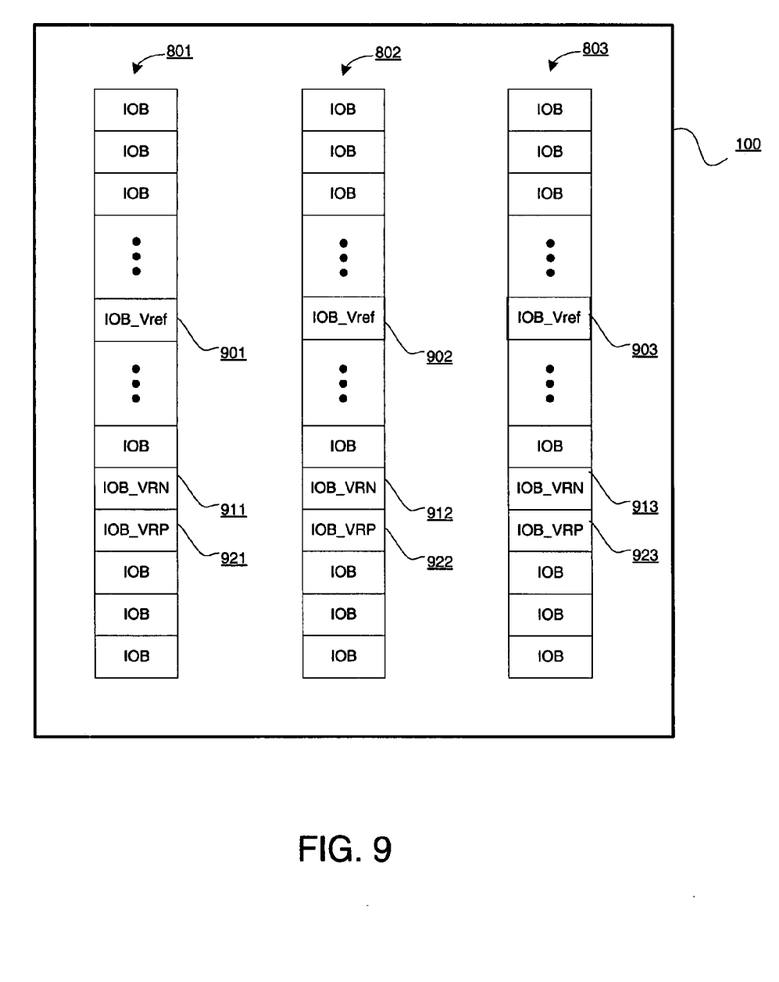
FIG. 9 is the block diagram of FIG. 8 where IOBs for providing reference voltages have been more particularly delineated.

FIG. 9 is the block diagram of FIG. 8 where IOBs for providing reference voltages have been more particularly delineated. For example, each of columns 801, 802, and 803 may include a respective IOB configured to provide a reference voltage, such as IOBs 901, 902, and 903, for high speed unidirectional signaling such as HSTL, SSTL, and the like. Each of columns 801, 802, and 803 may further include a pair of IOBs for providing a negative and a positive reference voltage level for LVDCI. More particularly, columns 801, 802, and 803 respectively may include an IOB configured to provide a negative polarity reference voltage ("IOB_VRN"), such as IOBs 911, 912, and 913, respectively, and columns 801, 802, and 803 each include an IOB configured to provide a positive polarity reference voltage ("IOB_VRP"), such as IOBs 921, 922, and 923, respectively. Thus, IOBs 911 and 921 form one pair, IOBs 912 and 922 form another pair, and IOBs 913 and 923 form yet another pair of IOBs for providing both a negative and a positive reference voltage for LVCDI as described with reference to FIG. 7. It should be appreciated that there are rules as to which ports, or "pins," may be shorted to other pins associated with each of the interface standards. Furthermore, it should be understood that to ensure that pins from different columns are available for use as different clock pins, one IOB column may be tested using another IOB column to provide signaling to the IOB column being tested. For example, testing of IOBs in column 801 may be done using IOBs in column 802 for clock input pins, and testing of IOBs in column 802 may be done using IOBs in column 801 for clock input pins.

Figure 10:
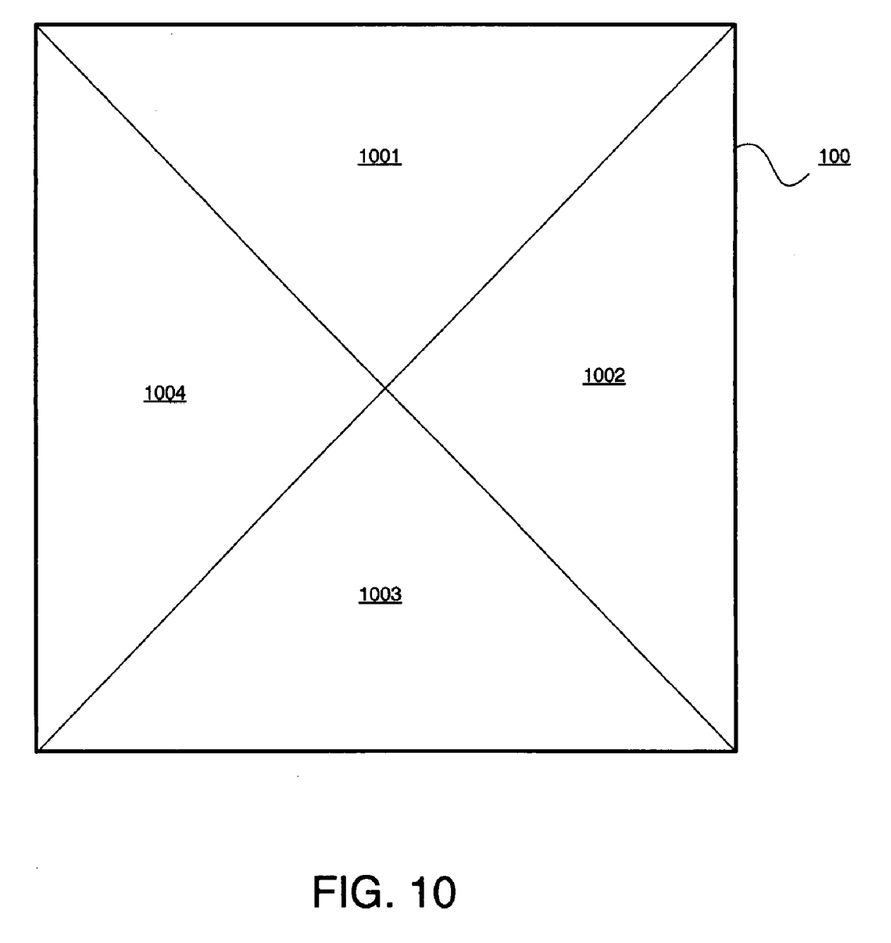
FIG. 10 is a high-level block diagram depicting an exemplary embodiment of the FPGA of FIG. 1 having multiple banks of signal pins.

FIG. 10 is a high-level block diagram depicting an exemplary embodiment of an FPGA 100 having multiple banks of FPGA package pins. By FPGA package pins, it should be understood to include pins of an FPGA die, as well as pins of a connector coupled to an FPGA die to form an FPGA microchip.

Notably, in some FPGAs, IOBs in the periphery may be arranged in banks, such as a top bank region 1001, a bottom bank region 1003, a right bank region 1002, and a left bank region 1004. The number of IOBs in any test pattern may vary, but to ensure that there are pins available for use as clock input pins from a different column of IOBs other than the columns of IOBs under test, pins may be assigned according to bank rather than IOB. For example, one test pattern may have IOBs in banks 1001 and 1002 clocked responsive to IOBs from 1004 and 1003.

It should be appreciated that more than one package I/O pin may be coupled to a single TC of a tester. It should be appreciated that flip-flops may be used to select one IOB of IOBs coupled to a TC via an associated package pin to be designated as part of an IOB under test. While the selected IOB is active, it should be understood that other IOBs coupled to such TC may be disabled.

It should be understood that in addition to direct current ("DC") I/O interfaces, other types of interfaces may be used. It should be understood that multiple I/O pads may be coupled together to form a pin group. The pin group allows more I/Os to be coupled to a single TC. Furthermore, it should be appreciated that only a selected activated I/O of a pin group is under test at any one time, which avoids issues associated with loading, as well as signal isolation.

Figure 11:
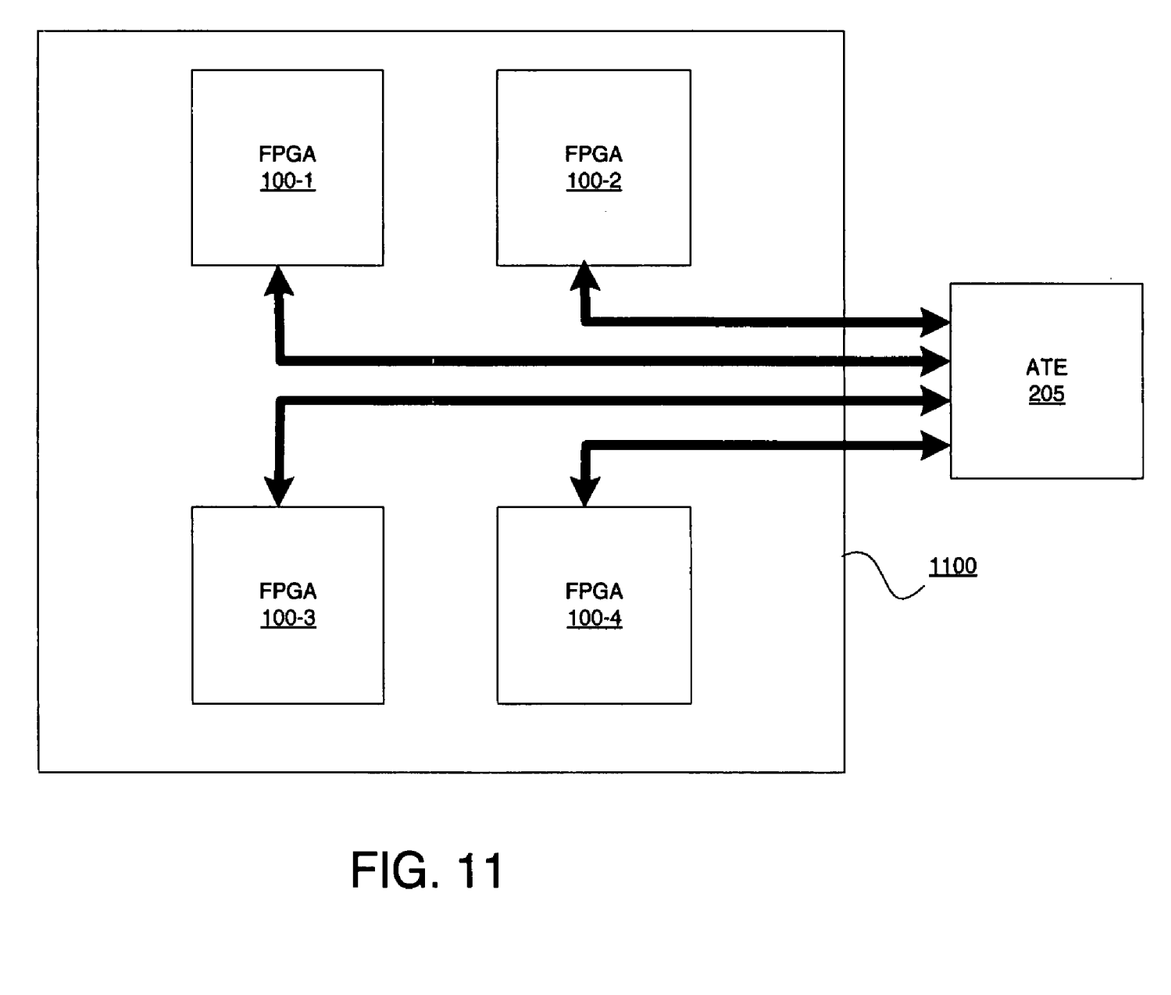
FIG. 11 is a high-level block diagram depicting an exemplary embodiment of a multi-site testing platform.

Additionally, by having a group of pins coupled to a single TC, TCs of a tester may be made available for testing other integrated circuits at the same time. For example, with reference to FIG. 11, where there is shown a high-level block diagram depicting a multi-site testing platform 1100, an ATE 205 may be coupled to such a multi-site testing platform 1100. Multi-site testing platform 1100 may have coupled thereto multiple integrated circuits, such as FPGAS 100-1 through 100-4. Because TCs of ATE 205 have been freed up as previously described, such TCs may be used for simultaneously testing multiple integrated circuits, such as the four FPGAs illustratively shown. Though four FPGAs are illustratively shown, it should be understood that fewer or more FPGAs may be tested using multi-site testing.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, combinations of single-ended interface protocols may be combined, combinations of differential-ended interface protocols may be combined, and combinations of single-ended and differential-ended interface protocols may be combined. Claim(s) listing steps do not imply any order of the steps. Trademarks are the property of their respective owners.

What is claimed is:

1. A system for testing an integrated circuit having programmable logic, the system comprising:
   a first output pad and a second output pad of the integrated circuit coupled to a common node to couple a test channel to the first output pad and the second output pad via the common node, the first output pad coupled to an output port of a first tri-state buffer, the second output pad coupled to an output port of a second tri-state buffer;
   an output port of a first register coupled to a control port of the first tri-state buffer and to an input port of a second register;
   an output port of the second register coupled to a control port of the second tri-state buffer and to an input port of a third register;
   an output port of the third register coupled to an input port of the first register;
   the first register and the second register coupled to receive a set signal to put the first register and the second register in a first state;
   the third register coupled to receive an inverted version of the set signal to put the third register in a second state; and
   the first register, the second register, and the third register coupled to receive a first clock signal.

2. The system according to claim 1, wherein:
   the first, second, and third register are clocked responsive to the first clock signal;
   the second state from the third register are provided to the first register responsive to a first cycle of the first clock signal;
   the first state from the first register are provided to the second register responsive to the first cycle of the first clock signal, the first tri-state buffer are in a tri-state mode responsive to the first state output from the first register; and
   the first state from the second register are provided to the third register responsive to the first cycle of the first clock signal, the second tri-state buffer are in the tri-state mode responsive to the first state output from the second register.

3. The system according to claim 2, wherein:
   the first, second, and third register are clocked responsive to the first clock signal;
   the first state from the third register are provided to the first register responsive to a second cycle of the first clock signal;
   the second state from the first register are provided to the second register responsive to the second cycle of the first clock signal, the first tri-state buffer are in a non-tri-state mode responsive to the second state output from the first register; and
   the first state from the second register are provided to the third register responsive to the second cycle of the first clock signal, the second tri-state buffer are in the tri-state mode responsive to the first state output from the second register.

4. The system according to claim 3, wherein:
   the first, second and third register are clocked responsive to the first clock signal;
   the first state from the third register are provided to the first register responsive to a third cycle of the first clock signal;
   the first state from the first register are provided to the second register responsive to the third cycle of the first clock signal, the first tri-state buffer are in the tri-state mode responsive to the first state output from the first register; and
   the second state from the second register are provided to the third register responsive to the third cycle of the first clock signal, the second tri-state buffer are in the non-tri-state mode responsive to the second state output from the second register.

5. The system according to claim 4, further comprising:
   an input port of the first tri-state buffer coupled to an output port of a first flip-flop via a first inverter, the output port of the first tri-state buffer coupled to an input port of a first input buffer;
   an output port of the first input buffer coupled to an input port of the first flip-flop;
   an input port of the second tri-state buffer coupled to an output port of a second flip-flop via a second inverter, the output port of the second tri-state buffer coupled to an input port of a second input buffer;
   an output port of the second input buffer coupled to an input port of the second flip-flop;
   the first flip-flop and the flip-flop coupled to receive the set signal to put the first flip-flop and the second flip-flop in the first state; and
   the first flip-flop and the second flip-flop coupled to receive a second clock signal.

6. The system according to claim 5, wherein frequency of the second clock signal is greater than frequency of the first clock signal.

7. The system according to claim 4, wherein the first tri-state buffer is part of a first input/output block, wherein the second tri-state buffer is part of a second input/output block, and wherein the first input/output block and the second input/output block are part of a programmable logic device.

8. The system according to claim 7, wherein the programmable logic device is a Field Programmable Gate Array.

9. The system according to claim 7, further comprising:
   a third output pad and a fourth output pad coupled to another common node to couple another test channel of the tester to the third output pad and the fourth output pad, the third output pad being associated with a third input/output block, the fourth output pad being associated with a fourth input/output block;
   wherein the third input/output block and the fourth input/output block are configured for high-speed single-ended signaling interface.

10. The system according to claim 9, wherein the high-speed single-ended signaling interface is selected from a High-Speed Transceiver Logic interface and Stub Series Terminated Logic interface.

11. The system according to claim 7, further comprising:
   a third input/output block and a fourth input/output block coupled to another common node to couple another test channel of the tester, the third input/output block and the fourth input/output block are configured for a positive polarity reference voltage to provide a portion of an impedance controlled interface; and
   a fifth input/output block and a sixth input/output block coupled to yet another common node to couple yet another test channel of the tester, the fifth input/output block and the sixth input/output block are configured for a negative polarity reference voltage to provide another portion of the impedance controlled interface.

12. The system according to claim 11, wherein the impedance controlled interface is a Digitally Controlled Impedance interface.

13. The system according to claim 7, wherein the first input/output block and the second input/output block are from different columns of input/output blocks.

14. The system according to claim 7, wherein the first input/output block and the second input/output block are from a first column of input/output blocks.

15. The system according to claim 14, further comprising a second column of input/output blocks coupled to the first column of input/output blocks to provide the first clock signal and the second clock signal from the tester to the integrated circuit.

16. The system according to claim 15, wherein the first column of input/output blocks is from a first signal bank, and wherein the second column of input/output blocks is from a second signal bank.

17. A system for testing an integrated circuit having programmable logic, the integrated circuit coupled to a tester, the system comprising:
   a first output pad and a second output pad of the integrated circuit coupled to a first common node to couple a first test channel of the tester to the first output pad and the second output pad via the common node, the first output pad coupled to a first output port of a first tri-state buffer, the second output pad coupled to a first output port of a second tri-state buffer;
   a third output pad and a fourth output pad of the integrated circuit coupled to a second common node to couple a second test channel of the tester to the third output pad and the fourth output pad via the common node, the third output pad coupled to a second output port of the first tri-state buffer, the fourth output pad coupled to a second output port of the second tri-state buffer;
   an output port of a first register coupled to a control port of the first tri-state buffer and to an input port of a second register;
   an output port of the second register coupled to a control port of the second tri-state buffer and to an input port of a third register;
   an output port of the third register coupled to an input port of the first register;
   the first register and the second register coupled to receive a set signal to put the first register and the second register in a first state;
   the third register coupled to receive an inverted version of the set signal to put the third register in a second state; and
   the first register, the second register, and the third register coupled to receive a clock signal.

18. The system according to claim 17, wherein the first output port of each of the first tri-state buffer and the second tri-state buffer is a positive side output port, and wherein the second output port of each of the first tri-state buffer and the second tri-state buffer is a negative side output port.

19. The system according to claim 18, further comprising an input node commonly coupled to an input port of each of the first tri-state buffer and the second tri-state buffer, wherein the first output pad, the second output pad, the third output pad and the fourth output pad in combination provide a differential-ended interface.

20. A method for testing an integrated circuit having programmable logic, the method comprising:
   programming a portion of the programmable logic to configure the integrated circuit to be coupled at an output node, the portion of the programmable logic configured to:
   receive a set signal to a daisy-chain of registers in a closed input/output loop, the set signal being inverted for one register of the daisy-chain of registers to provide one first logic state and a plurality of second logic states for respective registration in the daisy-chain of registers;
   receive a clock signal to clock the daisy-chain of registers responsive to cycles of the clock signal;
   circulate the one first logic state and the plurality of second logic states around the closed input/output loop responsive to the cycles of the clock signal, the one first logic state being registered in only one register of the daisy-chain of registers at a time such that the one first logic state is output from a different register responsive to each cycle of the clock signal;
   generate a series of outputs from a portion of the daisy-chain of registers responsive to the cycles of the clock signal;
   provide the series of outputs respectively to the portion of the daisy-chain of registers;
   commonly coupled output blocks at the output node; and
   control operation of the output blocks responsive to the series of outputs provided from the portion of the daisy-chain of registers to selectively place an output block of the output blocks in an output mode responsive to the one first logic state output in the series of outputs while leaving the output blocks remaining in a non-output mode responsive to the plurality of second logic states in the series of outputs; and
   coupling the output node to a test channel of a tester.

* * * * *